United States Patent
Yamada (10) Patent No.: US 7,377,046 B2
(45) Date of Patent: May 27, 2008

(54) INCLINATION SENSOR AND AZIMUTH MEASURING APPARATUS USING INCLINATION SENSOR

(75) Inventor: Yukimitsu Yamada, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/974,368

(22) Filed: Oct. 11, 2007

(65) Prior Publication Data
US 2008/0052933 A1    Mar. 6, 2008

Related U.S. Application Data (63) Continuation of application No. PCT/JP2006/007642, filed on Apr. 11, 2006.

(30) Foreign Application Priority Data
Apr. 25, 2005    (JP) .............................. 2005-126687

(51) Int. Cl.
    G01C 17/38    (2006.01)
(52) U.S. Cl. ......................... 33/356; 33/355 R; 33/365
(58) Field of Classification Search .......... 33/356–359, 33/335 R, 365–366; 702/92–93
    See application file for complete search history.

(56) References Cited

U.S. PATENT DOCUMENTS 7,268,544 B2 *  9/2007  Yamada ...................... 33/356
7,278,219 B2 * 10/2007  Honkura et al. ............... 33/356
2006/0168832 A1 *  8/2006  Yasui et al. ................... 33/356
2007/0119061 A1 *  5/2007  Lee et al. ...................... 33/356

FOREIGN PATENT DOCUMENTS

| JP | 3-154816 | 7/1991 |
| JP | 2000-356520 | 12/2000 |
| JP | 2002-196055 | 7/2002 |
| JP | 2005-265414 | 9/2005 |
| JP | 2006-113019 | 4/2006 |

OTHER PUBLICATIONS

International Search Report dated Jul. 3, 2006 from corresponding International Application No. PCT/JP2006/307642.

* cited by examiner

Primary Examiner—Yaritza Guadalupe-McCall
(74) Attorney, Agent, or Firm—Beyer Law Group LLP (57) ABSTRACT

A mobile device or the like having a 3-axis electronic compass is rotated, and the outputs from magnetic sensors disposed in the three axis directions are input to a first arithmetic processing unit (11) so as to obtain the magnetic data X, Y, and Z. By inputting the magnetic data X, Y, and Z to a second arithmetic processing unit (12), gains Gx and Gz can be obtained. A control unit (16) generates access codes x0 and z0 corresponding to the gains Gx and Gz. The correspondence between the access codes x0 and z0 and inclination angle (pitch angle) $\alpha$ or between the gains Gx and Gz and inclination angle (pitch angle) $\alpha$ is tabulated and stored in a memory unit (17). The control unit (16) accesses the memory unit (17) so as to obtain an inclination angle (pitch angle) $\alpha 0$ corresponding to the access codes x0 and z0.

10 Claims, 12 Drawing Sheets

FIG. 4A $\beta=0°$

FIG. 4B $\alpha=0°$

INCLINATION SENSOR AND AZIMUTH MEASURING APPARATUS USING INCLINATION SENSOR

CROSS REFERENCE TO RELATED APPLICATIONS

This application is a continuation of International Application No. PCT/JP2006/307642, file on Apr. 11, 2006, which is incorporated herein by reference in it's entirety.

TECHNICAL FIELD

The present invention relates to an inclination sensor using a 3-axis magnetic sensor and an azimuth measuring apparatus using the inclination sensor.

BACKGROUND ART

In a related art, a method is proposed in which an azimuth is detected while taking into account an error caused by an inclination angle (a posture angle with respect to the horizon plane) of a compass if the compass is set at an angle relative to the horizon plane (refer to, for example, Patent Document 1).

In a method described in Patent Document 1, a magnetic sensor 100, a hall element 24, and an inclination sensor 22 are integrated into one. The magnetic sensor 100 detects two axis components of a magnetic vector defined in a plane parallel to a substrate. The hall element 24 detects a component of the magnetic vector in a direction perpendicular to the substrate. The inclination sensor 22 detects an inclination angle of the substrate. A proper azimuth is detected by correcting the two axis components detected by the magnetic sensor 100 and the vertical component detected by the hall element 24 on the basis of the inclination angles (a roll angle and a pitch angle) of the substrate detected by the inclination sensor 22.

[Patent Document 1] Japanese Unexamined Patent Application Publication No. 2002-196055

DISCLOSURE OF INVENTION

Problems to be Solved by the Invention

However, in the method described in Patent Document 1, an inclination sensor is required used for correcting the inclination in addition to a 3-axis magnetic sensor used for detecting directions to the planet's magnetic poles. Accordingly, the size and the weight of the compass are increased. As a result, it is difficult to reduce the size and the weight of a mobile device that includes the compass.

Accordingly, the present invention provides an inclination sensor capable of computing an inclination angle from magnetic data acquired by a magnetic sensor.

The present invention further provides an azimuth measuring apparatus that can detect an azimuth without using a dedicated inclination sensor.

Means for Solving the Problems

According to the present invention, an inclination sensor includes a magnetic sensor for detecting magnetic components in three axis directions perpendicular to each other and computing means for acquiring an output from the magnetic sensor and performing computation. The computing means includes at least a first arithmetic processing unit for converting the magnetic components in three axis directions so as to generate three magnetic data items, a second arithmetic processing unit for calculating a predetermined access code from the magnetic data items, a memory unit for storing a plurality of data items relating to an inclination angle, and a control unit for controlling the units. When the control unit accesses the memory unit, the control unit reads out the inclination angle corresponding to the access code.

For example, when the magnetic sensor is rotated about any one of the three axes, the second arithmetic processing unit generates an elliptical Lissajous curve using the magnetic data items relating to the other two axes and calculates the length of one of a major axis and a minor axis of the ellipse, and the second arithmetic processing unit determines one of the lengths that changes in accordance with the rotation to be the access code.

Alternatively, when the magnetic sensor is rotated about any one of the three axes, the second arithmetic processing unit generates an elliptical Lissajous curve using the magnetic data items relating to the other two axes and calculates the length of one of a major axis and a minor axis of the ellipse, and the second arithmetic processing unit determines a ratio between the length of the major axis and the length of the minor axis to be the access code.

It is desirable that the rotation about any one of the three axes is more than or equal to one revolution.

However, if the rotation about any one of the three axes is less than one revolution, the second arithmetic processing unit can determine the length of the minor axis of the ellipse obtained using the length of the major axis of the ellipse stored in the memory unit as a known value and magnetic data input as any one point on the ellipse to be the access code, or the second arithmetic processing unit can determine a ratio between the length of the major axis and the length of the minor axis to be the access code.

According to the present invention, an azimuth measuring apparatus computes an azimuth using the magnetic data items converted from the magnetic components in the three axis directions and an inclination angle computed by any one of the inclination sensors described above.

It is desirable that the azimuth measuring apparatus further includes magnetic inclination and declination acquiring means for detecting the measuring location using radio waves received from GPS artificial satellites, and data relating to the magnetic inclination and the magnetic declination corresponding to the measuring location are read out from a memory unit.

Alternatively, it is desirable that the azimuth measuring apparatus further includes magnetic inclination and declination acquiring means for detecting a measuring location via communication with a relay station of a cell phone system, and data relating to the magnetic inclination and the magnetic declination corresponding to the measuring location are acquired from a memory unit or via the relay station.

Advantages

The present invention can provide an inclination sensor using a 3-axis magnetic sensor. Accordingly, the need for a dedicated inclination sensor can be eliminated. Thus, the size and the weight of an azimuth measuring apparatus including such a 3-axis magnetic sensor can be decreased.

REFERENCE NUMERALS 1 mobile device (cell phone)
2 3-axis electronic compass (azimuth measuring apparatus)
3, 4, 5 magnetic sensor (magnetic detecting means)
10 computing means
11 first arithmetic processing unit
12 second arithmetic processing unit
13 third arithmetic processing unit
14 fourth arithmetic processing unit
16 control unit
17 memory unit
20 magnetic inclination and declination acquiring means
D magnetic declination
H geomagnetic vector
Hxy horizontal component of geomagnetic vector
Hx x-axis component of geomagnetic vector
Hy y-axis component of geomagnetic vector
Hz z-axis component of geomagnetic vector
Hx' x'-axis component of geomagnetic vector (measurement value)
Hy' y'-axis component of geomagnetic vector (measurement value)
Hz' z'-axis component of geomagnetic vector (measurement value)
x', y', z' Cartesian coordinate system fixed to mobile device (x'y'z' Cartesian coordinate system)
x, y, z Cartesian coordinate system (coordinate system fixed to mobile device when x'y' plane is horizon plane and z'-axis is oriented in the vertical direction)
X, Y, Z magnetic data (values converted from geomagnetic vector components Hx', Hy', and Hz')
α pitch angle of mobile device (inclination angle)
α0 computed value of pitch angle (inclination angle)
η magnetic inclination
θ azimuth with respect to magnetic north
θ' azimuth with respect to true north

BEST MODE FOR CARRYING OUT THE INVENTION

Figure 1:
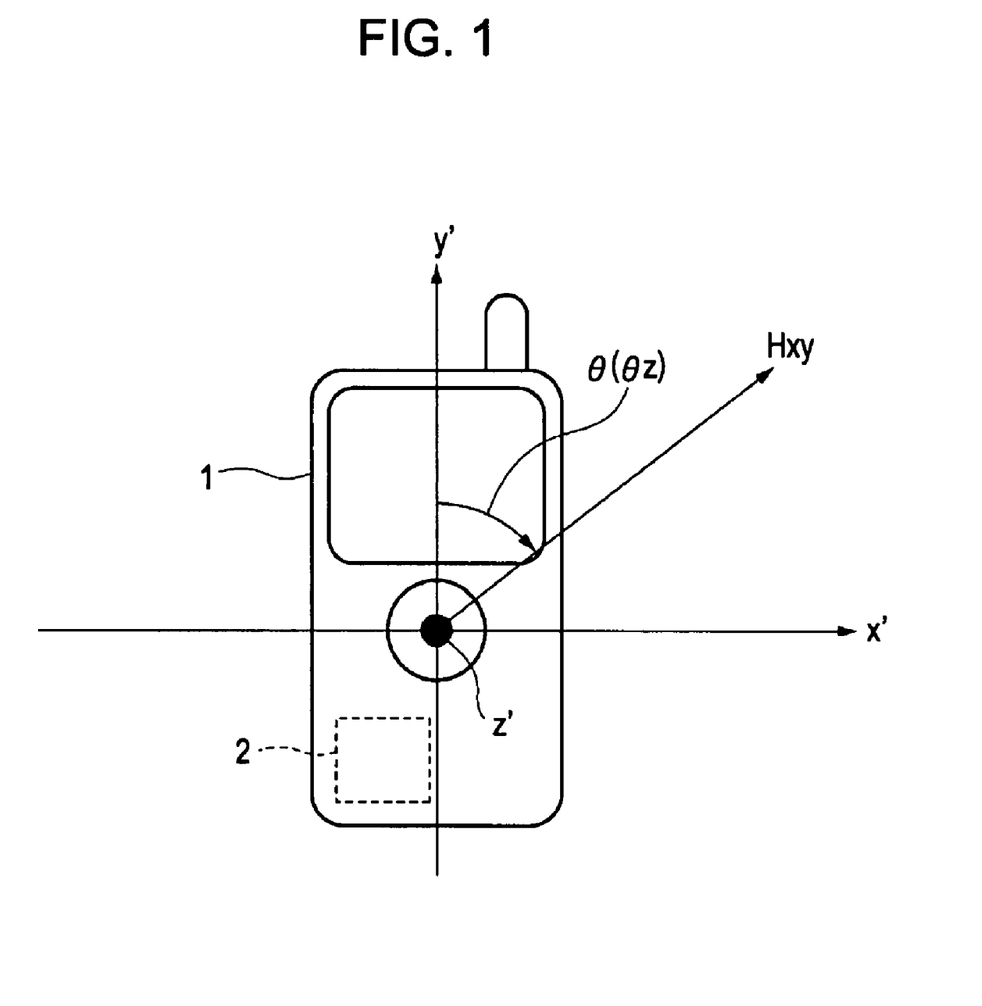
FIG. 1 is a plan view two-dimensionally illustrating a relationship between a mobile device including a 3-axis electronic compass serving as an azimuth measuring apparatus and an azimuth.
Figure 2:
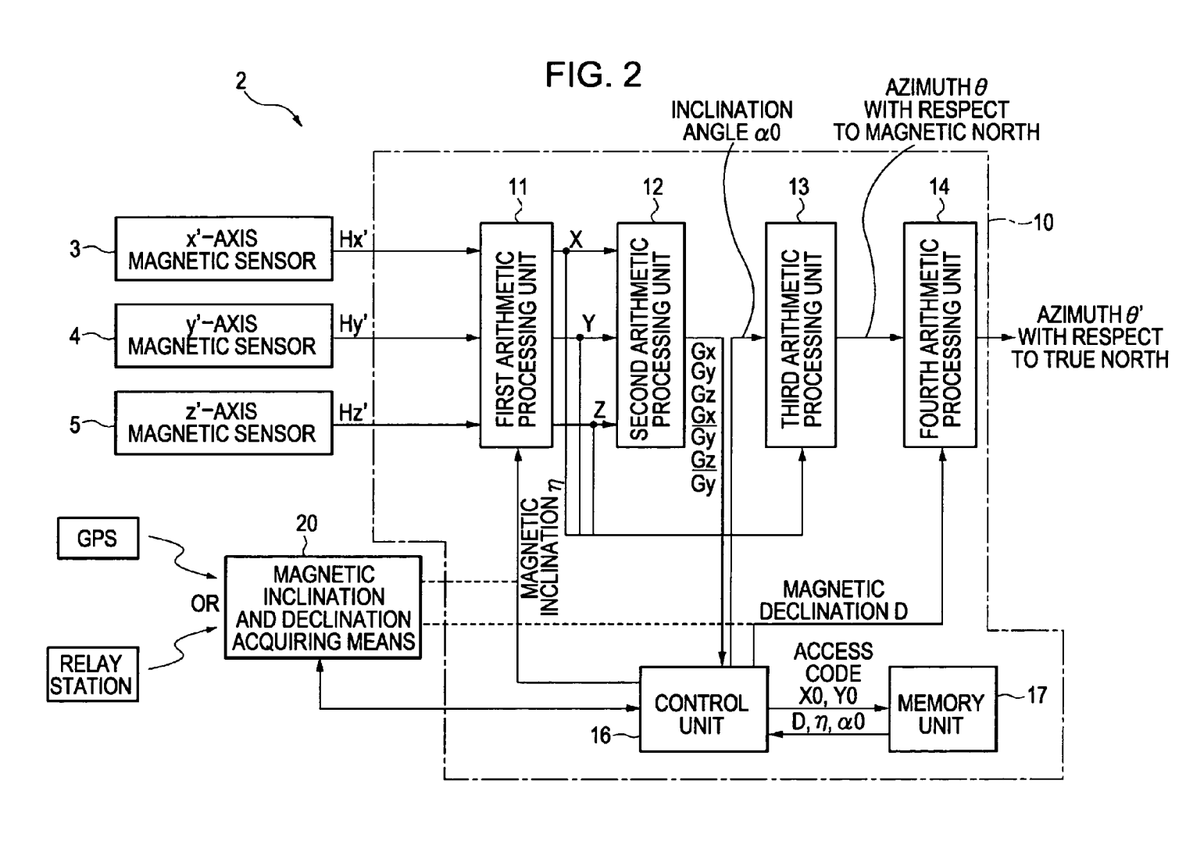
FIG. 2 is a block diagram of the configuration of the 3-axis electronic compass.
Figure 3:
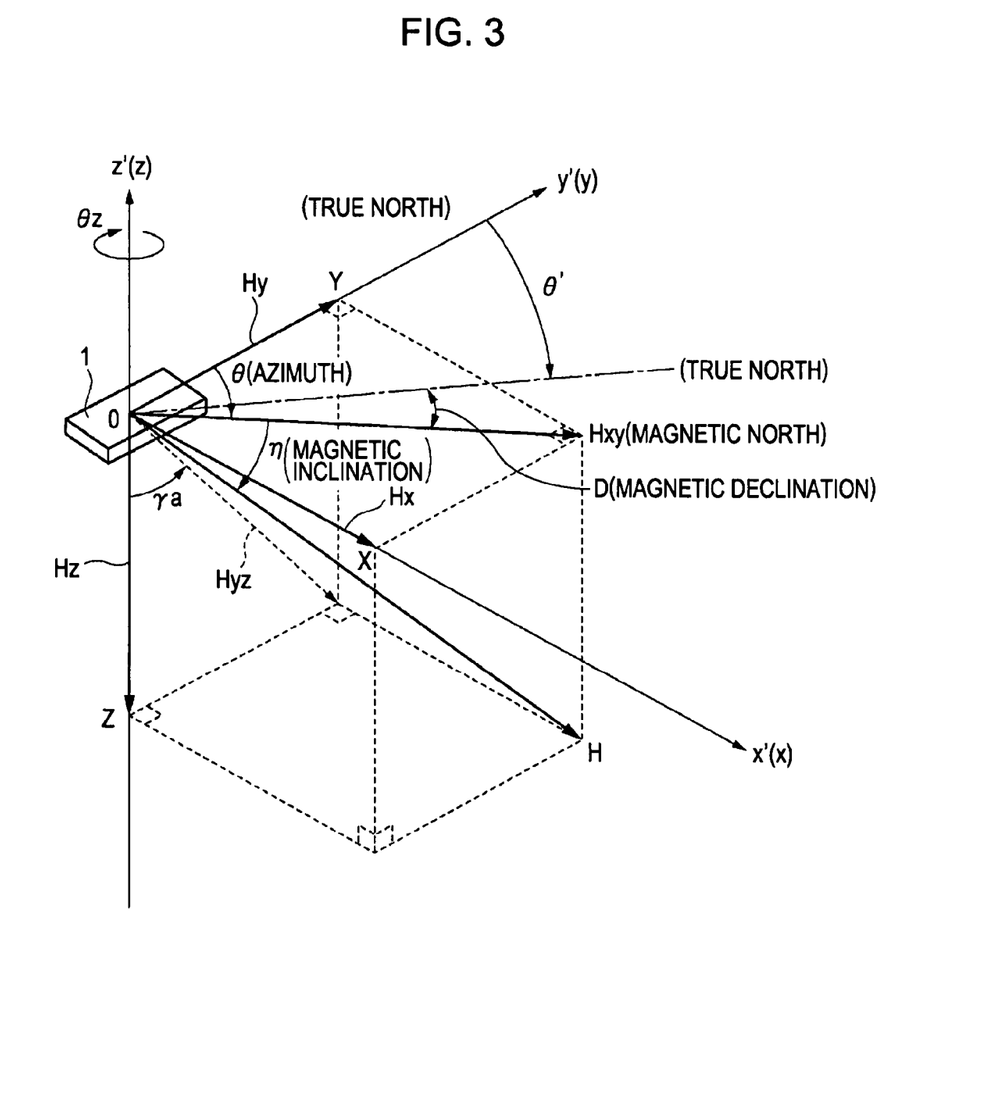
FIG. 3 is an azimuth analysis diagram three-dimensionally illustrating the principle of inclination correction.
Figure 4A:
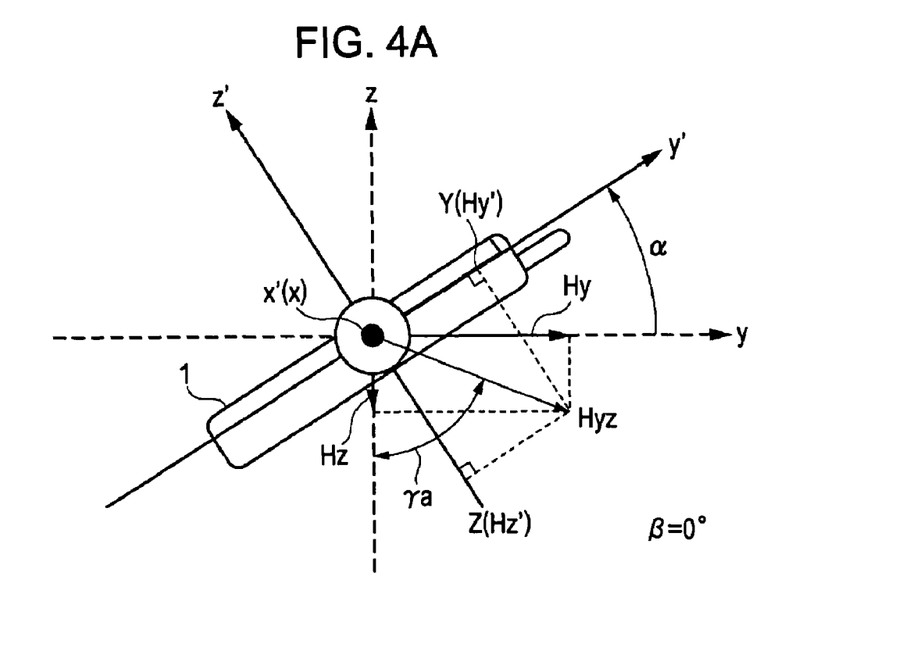
FIG. 4A is a side view of the mobile device two-dimensionally illustrating the mobile device inclined at a pitch angle of α about an x-axis.
Figure 4B:
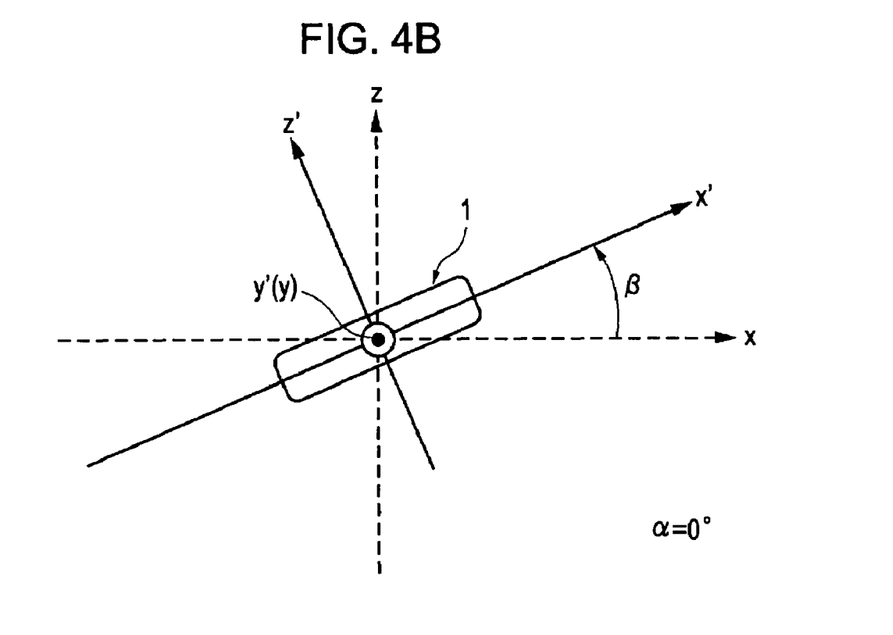
FIG. 4B is a bottom view of the mobile device two-dimensionally illustrating the mobile device inclined at a pitch angle of β about a y-axis.

FIG. 1 is a plan view illustrating a two-dimensional relationship between a mobile device including a 3-axis electronic compass serving as an azimuth measuring apparatus and an azimuth. FIG. 2 is a block diagram of the configuration of the 3-axis electronic compass. FIG. 3 is an azimuth analysis diagram three-dimensionally illustrating the principle of inclination correction. FIG. 4A is a side view of a mobile device two-dimensionally illustrated when the mobile device is inclined at a pitch angle of α about an x-axis. FIG. 4B is a bottom view of a mobile device two-dimensionally illustrated when the mobile device is inclined at a pitch angle of β about a y-axis.

FIG. 1 illustrates a cell phone, which is a typical mobile device 1. The mobile device 1 includes a 3-axis electronic compass (an azimuth measuring apparatus) 2. As shown in FIG. 2, the 3-axis electronic compass 2 includes three magnetic sensors 3, 4, and 5 that function as magnetic detecting means for detecting the intensities of a magnetic field in axis directions. The magnetic sensors 3, 4, and 5 are disposed so as to be perpendicular to each other. As shown in FIG. 1, assume that an x'-axis represents the width direction of the mobile device 1, a y'-axis represents the length direction of the mobile device 1, and a z'-axis represents the thickness direction of the mobile device 1. Then, the magnetic sensor 3 can detect the intensity of a magnetic field in an x'-axis direction. The magnetic sensor 4 can detect the intensity of the magnetic field in a y'-axis direction. The magnetic sensor 5 can detect the intensity of the magnetic field in a z'-axis direction. Accordingly, in the 3-axis electronic compass 2, the three magnetic sensors 3, 4, and 5 form a x'y'z' Cartesian coordinate system. Thus, the 3-axis electronic compass 2 can detect a geomagnetic vector H of the magnetic field around the earth in the form of the components in the three axes.

Examples of a magnetic sensor used in the magnetic detecting means include an existing magneto resistive (MR) sensor, a hall element, a flux-gate magnetic sensor (refer to Japanese Unexamined Patent Application Publication Nos. 9-43322 and 11-118892), or a sensor including a GIG (granulau in gap) element.

As shown in FIG. 2, the 3-axis electronic compass 2 includes computing means 10. The computing means 10 includes a first arithmetic processing unit 11, a second arithmetic processing unit 12, a third arithmetic processing unit 13, and a fourth arithmetic processing unit 14. The first to fourth arithmetic processing units 11 to 14 are described in more detail below.

The 3-axis electronic compass 2 further includes a control unit 16 for controlling the magnetic detecting means, the computing means 10, and a memory unit 17, which is described below.

In the following description, an x'y'z' Cartesian coordinate system that changes in accordance with the inclination of the mobile device 1 is used. An xyz Cartesian coordinate system is defined as an x'y'z' Cartesian coordinate system in the case where the x'-axis and y'-axis form a horizontal plane (an x'y' plane (horizon plane)) that is parallel to the ground, the y-axis' is directed to true north, and the z'-axis that is perpendicular to the x'-axis and the y'-axis is directed to a vertical direction (a direction of gravitational force). The xyz Cartesian coordinate system forms a fixed reference coordinate system. Therefore, the xyz Cartesian coordinate system is different from the x'y'z' Cartesian coordinate system which changes in accordance with the inclination of the mobile device 1.

Reference symbols Hx, Hy, Hz denote the values of an x-axis component, a y-axis component, and a z-axis component of the geomagnetic vector H (i.e., the intensity of a magnetic field) detected by the magnetic sensors 3, 4, and 5 in the xyz Cartesian coordinate system, respectively. A reference symbol Hxy denotes a horizontal component of the geomagnetic vector H when the geomagnetic vector H is projected onto the horizon plane (xy plane). In addition, the reference symbol Hxy indicates the direction of magnetic north (refer to FIG. 1). A reference symbol Hxyz denotes a component of the geomagnetic vector H when the geomagnetic vector H is projected onto a vertical yz plane (refer to FIG. 4A).

In FIGS. 1 and 3, an azimuth θ is an angle between a reference y'-axis and magnetic north (the horizontal component Hxy of the geomagnetic vector H). An azimuth θ' angle between the reference y'-axis and true north. That is, the azimuth θ' is the angle that the 3-axis electronic compass according to the present invention attempts to compute.

In FIG. 4A, when the mobile device 1 is rotated about the x'-axis (x-axis), a symbol α denotes an inclination angle (hereinafter referred to as a "pitch angle") formed by the y-axis (or the horizon plane (the xy plane)) and the y'-axis (or the x'y' plane) after the rotation. In FIG. 4B, when the mobile device 1 is rotated about the y'-axis (y-axis), a symbol β denotes an inclination angle (hereinafter referred to as a "roll angle") formed by the x-axis (or the horizon plane (the xy plane)) and the x'-axis (or the x'y' plane) after the rotation.

In FIG. 3, a symbol η denotes an angle formed by the horizon plane (the xy plane) and the geomagnetic vector H passing through the horizon plane, that is, a magnetic inclination. A plus sign indicates a downward direction. However, the magnetic inclination η changes with location. In the northern hemisphere, the magnetic inclination η tends to increase with latitude.

The value of the magnetic inclination η is determined for each of geographic locations (the degrees of latitude and longitude). For example, η=49° for Tokyo. In addition, a magnetic declination D (an angle difference between magnetic north and true north) changes in accordance with the measuring location. Precise magnetic inclination data in Japan are provided by the Geographical Survey Institute. The data are updated every three months.

Accordingly, although the following factor is not essential for the present invention, it is desirable that the 3-axis electronic compass 2 includes magnetic inclination and declination acquiring means 20 as shown in FIG. 2. In such a structure, the magnetic inclination η and the magnetic declination D corresponding to each of the locations can be stored in the memory unit 17.

For example, the current measuring location can be acquired via artificial satellites for a GPS (global positioning system) included in the mobile device 1. Thereafter, the mobile device 1 can read out the magnetic inclination η and the magnetic declination D corresponding to the current measuring location from the memory unit 17 or update these data. Alternatively, in the case where the mobile device 1 is a cell phone, the mobile device 1 may detect an area where the mobile device 1 is used (i.e., current measuring location) using the location of a relay station to which the mobile device 1 is connected when the mobile device 1 is in a calling or e-mailing state. Thereafter, the mobile device 1 can read out data regarding the magnetic inclination η and the magnetic declination D from the memory unit 17 in the same manner as described above or directly acquire data regarding the magnetic inclination η and the magnetic declination D via the relay station.

In particular, if the magnetic inclination η is known, a magnetic component in a Z-axis direction can be computed using two sensors disposed in the horizontal direction (the X-axis sensor and the Y-axis sensor) and the magnetic inclination η. Thus, the need for the Z-axis sensor can be advantageously eliminated.

The operations of the inclination sensor and the azimuth measuring apparatus including the inclination sensor according to the present invention are described next.

A method for detecting an azimuth θ with respect to magnetic north in the simplest case is described next. That is, the mobile device 1 is placed at the center of the xyz Cartesian coordinate system, and the pitch angle α and the roll angle β are set so that α=β=0°. In such a case, an azimuth θ with respect to magnetic north is computed. Note that when the pitch angle α and the roll angle β are 0°, the xyz Cartesian coordinate system is coincident with the x'y'z' Cartesian coordinate system.

In this case, components of the geomagnetic vector H detected by the electronic compass in the x'y'z' Cartesian coordinate system are the same as those of the geomagnetic vector H in the xyz Cartesian coordinate system. Accordingly, components Hx, Hy, and Hz of the geomagnetic vector H can be expressed using the azimuth θ and the magnetic inclination η as follows:

$$\begin{bmatrix} Hx \\ Hy \\ Hz \end{bmatrix} = H \begin{bmatrix} \cos\eta \cdot \sin\theta \\ \cos\eta \cdot \cos\theta \\ \sin\eta \end{bmatrix} \quad (1)$$

As shown in FIGS. 1 and 3, since the azimuth θ is an angle formed by the y'-axis (coincident with the y-axis in this case) and the horizontal component Hxy of the geomagnetic vector, the azimuth θ can be expressed as follows:

$$\theta = \tan^{-1}\left(\frac{Hx}{Hy}\right) \quad (2)$$

A method for computing the azimuth θ is described in the case where a pitch angle α occurs in the mobile device 1 as shown in FIG. 4A. In this case, the roll angle β=0°.

When the mobile device 1 (the electronic compass 2) is rotated about the x-axis, components Hx', Hy', and Hz' of the geomagnetic vector H are detected by the magnetic sensors 3, 4, and 5 in the x'y'z' Cartesian coordinate system. Let magnetic data X (=k·Hx'), Y (=k·Hy'), Z (=k·Hz') denote the voltages converted from the components Hx', Hy', and Hz' of the geomagnetic vector H using a predetermined conversion coefficient k (≠0), respectively. In addition, let Hx, Hy, and Hz denote the geomagnetic vector H represented in the xyz Cartesian coordinate system. Then, the relationship between the magnetic data X, Y, and Z and the components Hx, Hy, and Hz can be expressed using a matrix conversion equation about the x-axis as follows:

$$\begin{bmatrix} Hx \\ Hy \\ Hz \end{bmatrix} = \begin{bmatrix} 1 & 0 & 0 \\ 0 & \cos\alpha & -\sin\alpha \\ 0 & \sin\alpha & \cos\alpha \end{bmatrix} \begin{bmatrix} X \\ Y \\ Z \end{bmatrix} = \begin{bmatrix} X \\ Y\cos\alpha - Z\sin\alpha \\ Y\sin\alpha + Z\cos\alpha \end{bmatrix} \quad (3)$$

The conversion from the components Hx', Hy', and Hz' of the geomagnetic vector H to the magnetic data X, Y, and Z is performed by the first arithmetic processing unit 11.

Note that when the pitch angle α=0° (and the roll angle β=0°), the following expression is derived by substituting α=0° into equation (3):

$$\begin{bmatrix} Hx \\ Hy \\ Hz \end{bmatrix} = \begin{bmatrix} X \\ Y \\ Z \end{bmatrix} \quad (4)$$

This equation indicates that the xyz Cartesian coordinate system is completely coincident with the x'y'z' Cartesian coordinate system.

An azimuth θ when the pitch angle α occurs in the mobile device 1 can be expressed using equations (2) and (3) as follows:

$$\theta = \tan^{-1}\left(\frac{Hx}{Hy}\right) = \tan^{-1}\left(\frac{X}{Y\cos\alpha - Z\sin\alpha}\right) \quad (5)$$

As can be seen from equation (5), the pitch angle α needs to be known in order to obtain the azimuth θ. At the same time, equation (5) indicates that the magnetic inclination η and the magnetic declination D are not needed for obtaining the azimuth θ.

As shown in FIG. 4A, the pitch angle α is an inclination angle of the mobile device 1 (i.e., the x'y' plane) relative to the horizontal plane (i.e., the xy plane). Accordingly, by obtaining an inclination angle of the mobile device 1 (i.e., the x'y' plane) using an inclination sensor, the azimuth θ can be obtained.

However, according to the present invention, a dedicated inclination sensor is not provided. In such a case, the pitch angle α can be obtained using a method described below.

Figure 5:
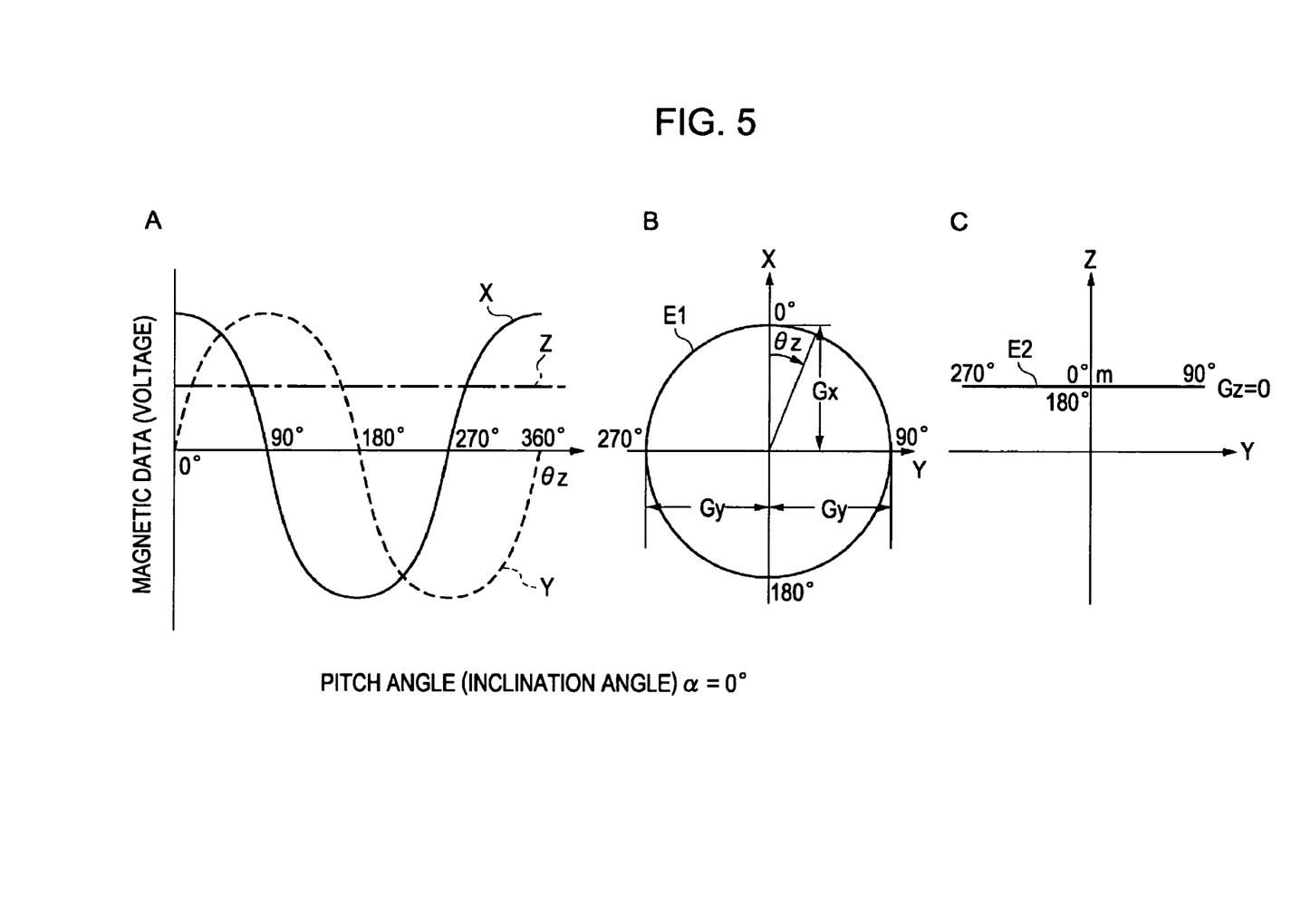
FIG. 5A is a graph illustrating a relationship between a rotation angle and magnetic data X, Y, and Z when the mobile device is rotated at a pitch angle α=0°.
FIG. 5B illustrates a Lissajous curve formed by the magnetic data Y and the magnetic data X.
FIG. 5C illustrates a Lissajous curve formed by the magnetic data Y and the magnetic data Z.
Figure 6:
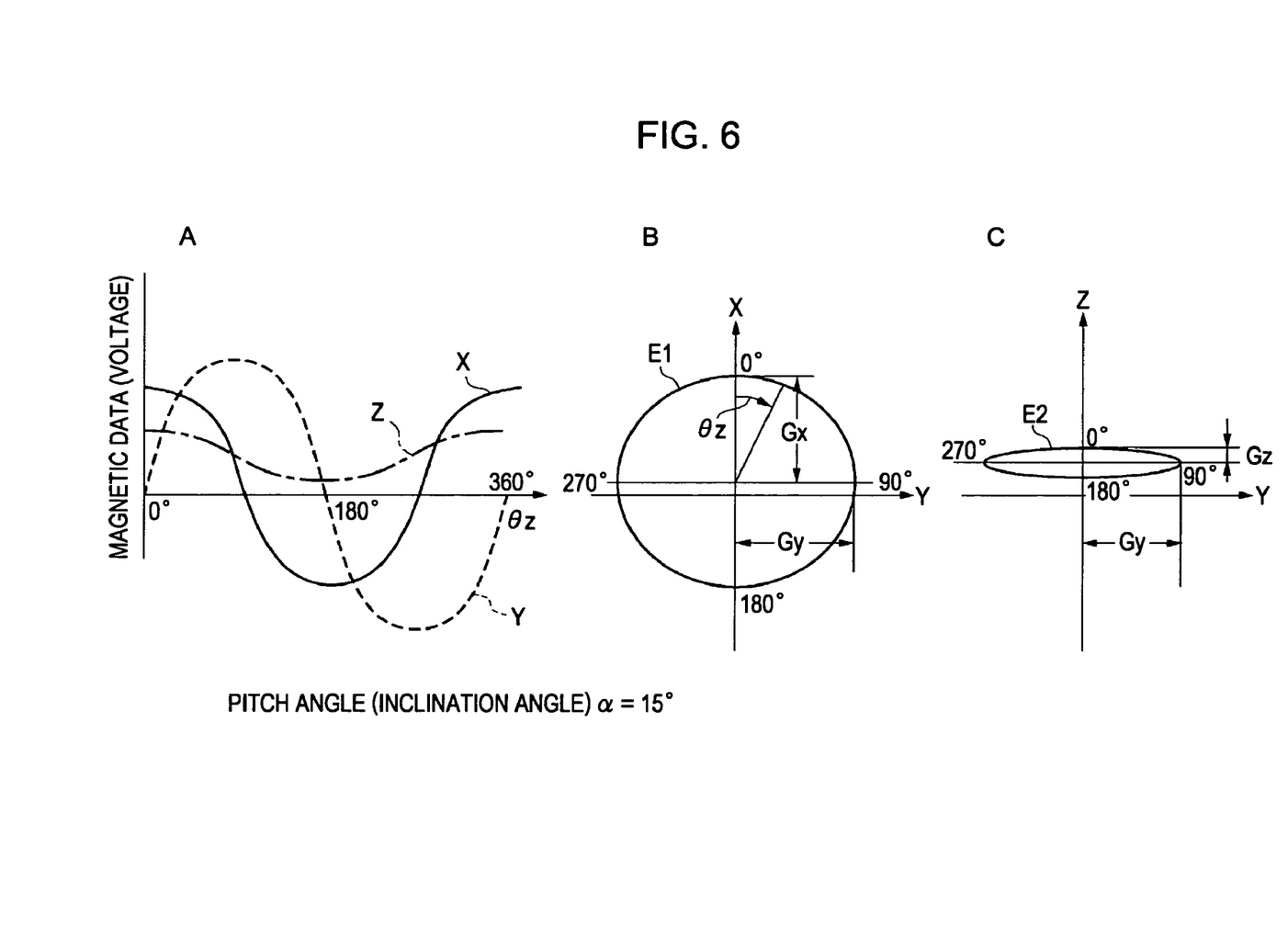
FIG. 6A is a graph illustrating a relationship between a rotation angle and magnetic data X, Y, and Z when the mobile device is rotated at a pitch angle α=15°.
FIG. 6B illustrates a Lissajous curve formed by the magnetic data Y and the magnetic data X.
FIG. 6C illustrates a Lissajous curve formed by the magnetic data Y and the magnetic data Z.
Figure 7:
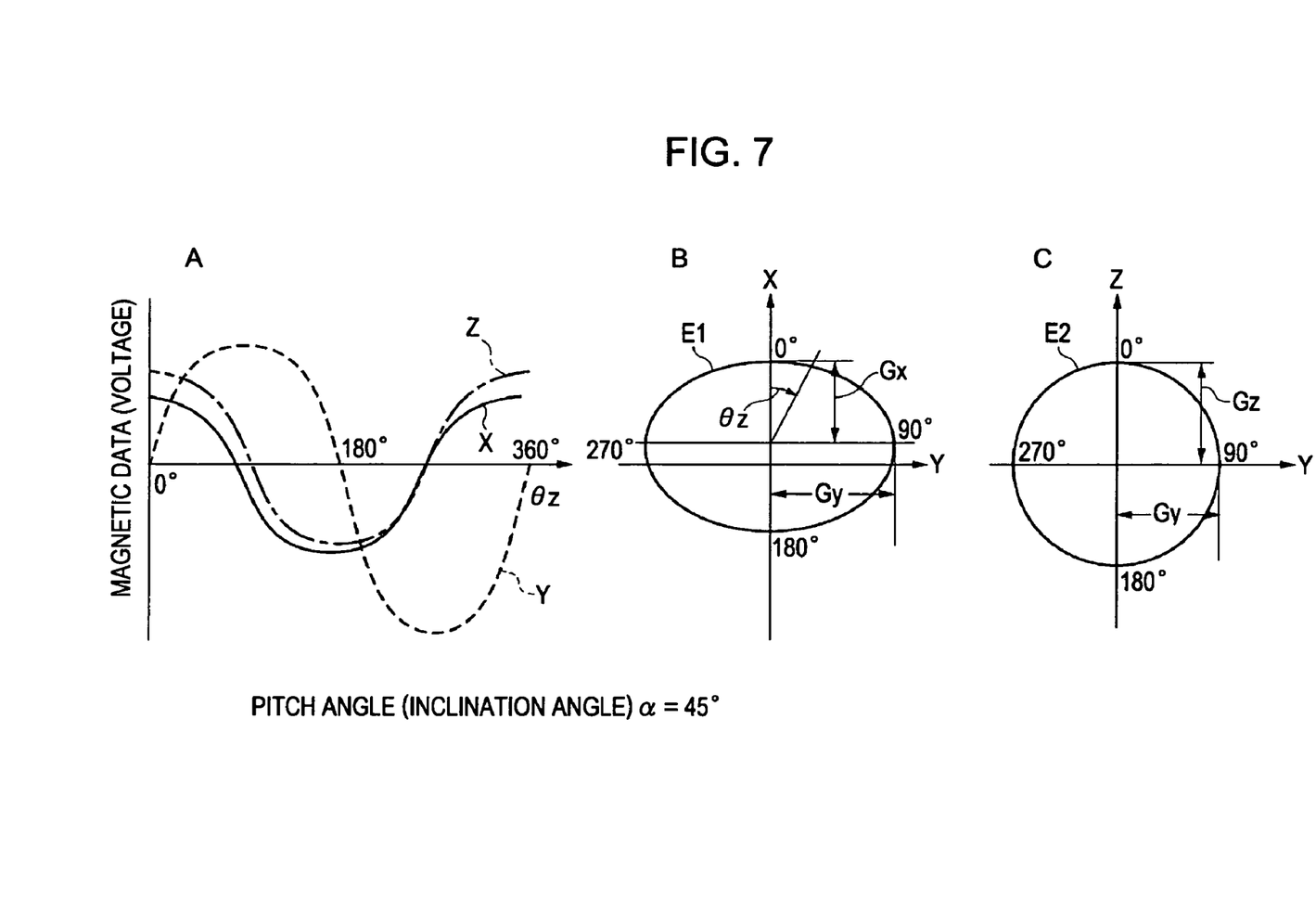
FIG. 7A is a graph illustrating a relationship between a rotation angle and magnetic data X, Y, and Z when the mobile device is rotated at a pitch angle α=45°.
FIG. 7B illustrates a Lissajous curve formed by the magnetic data Y and the magnetic data X.
FIG. 7C illustrates a Lissajous curve formed by the magnetic data Y and the magnetic data Z.
Figure 9:
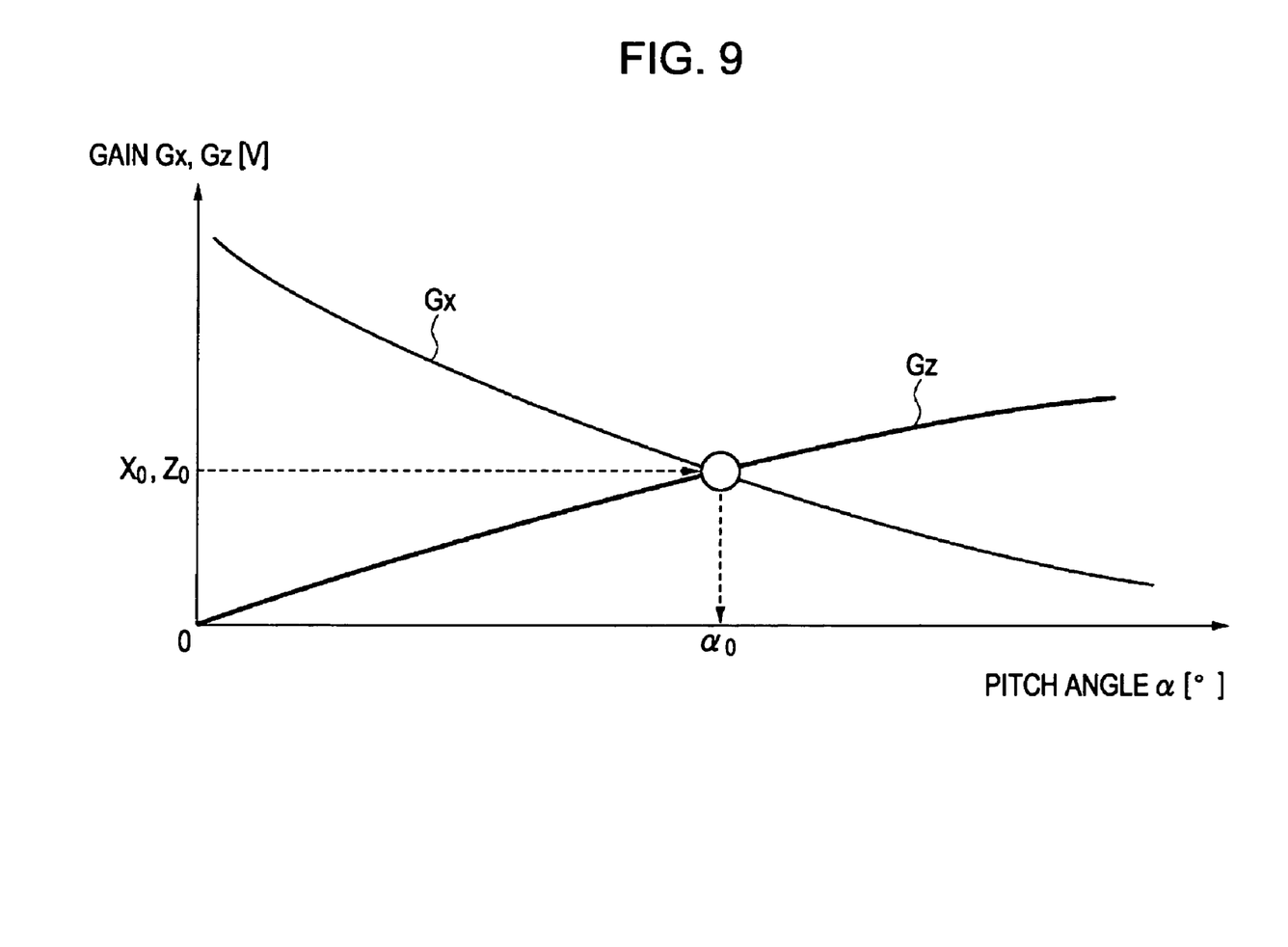
FIG. 9 is a graph illustrating a relationship between the pitch angle α and gains Gx and Gz.
Figure 10:
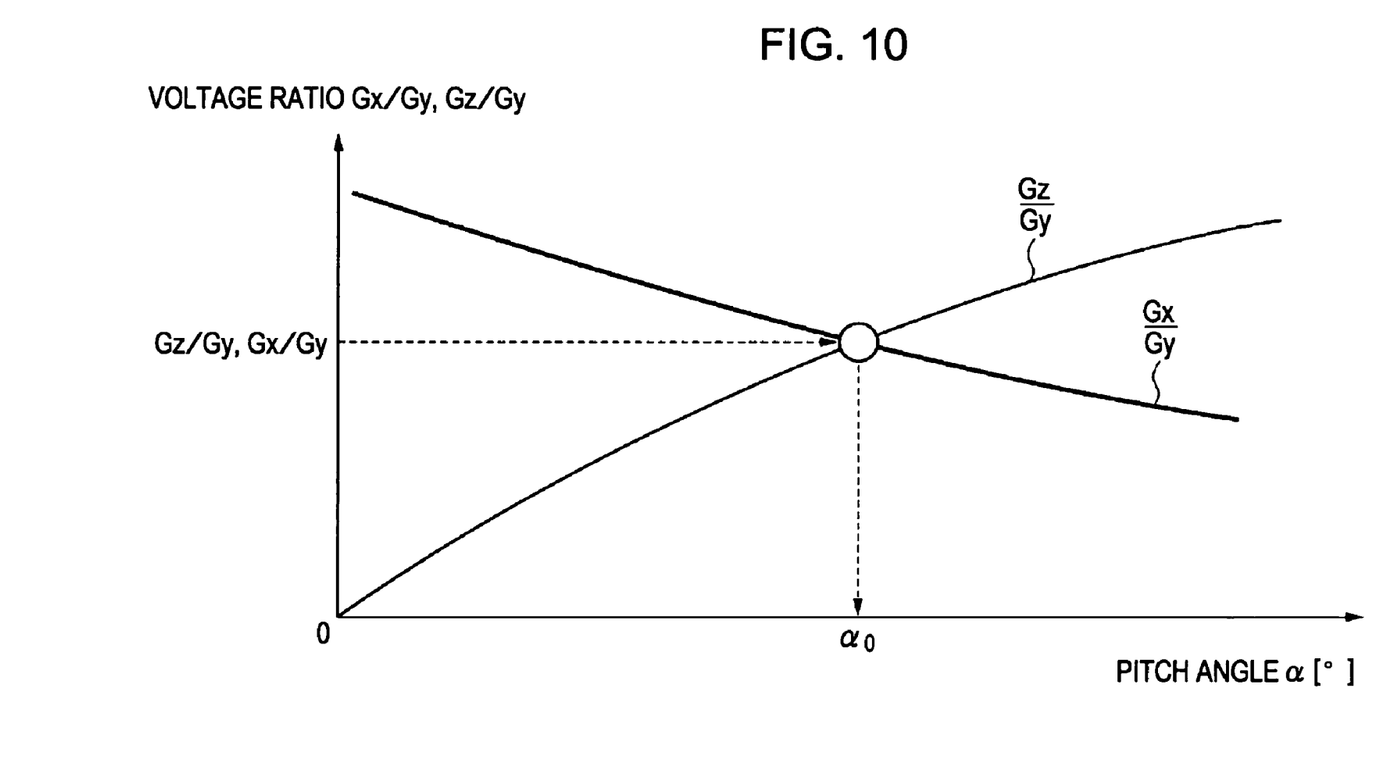
FIG. 10 is a graph illustrating a relationship between the pitch angle α and ratios Gx/Gy and Gz/Gy.

In FIGS. 5 through 8, a case number A represents a graph illustrating a relationship between a rotation angle θz and magnetic data X, Y, and Z detected when the mobile device 1 is rotated one revolution (360°) about the z-axis. A case number B represents a Lissajous curve formed in a graph in which the abscissa represents the magnetic data Y and the ordinate represents the magnetic data X. A case number C represents a Lissajous curve formed in a graph in which the abscissa represents the magnetic data Y and the ordinate represents the magnetic data Z. FIG. 5 illustrates the case where the pitch angle α (inclination angle)=0°. FIG. 6 illustrates the case where the pitch angle α (inclination angle)=15°. FIG. 5 illustrates the case where the pitch angle α (inclination angle)=45°. FIG. 5 illustrates the case where the pitch angle α (inclination angle)=60°. Note that the pitch angle α is an inclination angle about the x-axis (refer to FIG. 4A). FIG. 9 is a graph illustrating a relationship between the pitch angle α and gains Gx and Gz. FIG. 10 is a graph illustrating a relationship between the pitch angle α and ratios Gx/Gy and Gz/Gy.

As shown in FIG. 5, when the pitch angle α=0° and the mobile device 1 is rotated one revolution (360°) about the z-axis, a plurality of detected magnetic data Z (converted values of the geomagnetic vector component Hz' in the z'-axis direction detected by the magnetic sensor 5) are constant. In contrast, the magnetic data X (converted values of the geomagnetic vector component Hx' in the x'-axis direction detected by the magnetic sensor 3) exhibit a cosine wave. The magnetic data Y (converted values of the geomagnetic vector component Hy' in the y'-axis direction detected by the magnetic sensor 4) exhibit a sine wave. Accordingly, as shown in FIG. 5B, a Lissajous curve E1 formed by the plurality of magnetic data X and Y has a circular shape. In addition, as shown in FIG. 5C, a Lissajous curve E2 formed by the plurality of magnetic data Y and Z becomes a "Z=m" straight line, where m is any non-zero constant.

Subsequently, as shown in FIG. 6A, when the mobile device 1 is inclined so that the pitch angle α=15° and is rotated one revolution (360°) about the z-axis, a plurality of detected magnetic data Z exhibit a cosine wave. In contrast, although the magnetic data X exhibit a cosine wave, the amplitude of the cosine wave is decreased as compared with the cosine wave shown in FIG. 5A. The magnetic data Y exhibit a sine wave, which is similar to that when the pitch angle α=0°. As a result, as shown in FIG. 6B, a Lissajous curve E1 formed by the plurality of magnetic data Y and X is changed to an ellipse which is slightly squashed in the longitudinal direction. In contrast, as shown in FIG. 6C, a Lissajous curve E2 formed by the plurality of magnetic data Y and X is changed to an ellipse having a minor axis in the longitudinal direction and a major axis in the transverse direction.

Similarly, as shown in FIGS. 7A and 8A, as the pitch angle α is gradually increased to 45°, and to 60°, the amplitude of the magnetic data X is decreased. However, the amplitude of the magnetic data Z is increased. The magnetic data Y remain unchanged as in the cases where the pitch angle α=0° and α=15° so that a sine wave having a substantially constant amplitude is maintained.

As a result, as shown in FIGS. 5B, 6B, 7B, and 8B, as the pitch angle α is increased, the magnetic data X represented by the ordinate is gradually decreased, although the amplitude of the magnetic data Y represented by the abscissa remains unchanged. Accordingly, the Lissajous curve E1 formed by the plurality of magnetic data Y and X is gradually changed from a circle figure to an ellipse which is slightly squashed in the longitudinal direction.

As the same time, as shown in FIGS. 5C, 6C, 7C, and 8C, as the pitch angle α is increased, the magnetic data Z represented by the ordinate is gradually increased, although the amplitude of the magnetic data Y represented by the abscissa remains unchanged. Accordingly, the Lissajous curve E2 formed by the plurality of magnetic data Y and Z is gradually changed from a straight line to a circle figure, and to a vertically long ellipse.

Therefore, the second arithmetic processing unit 12 computes the value of the magnetic data X when the rotation angle θz provided from the first arithmetic processing unit 11 is 0°, that is, a maximum voltage of the magnetic data X represented by the length (minor axis) of a short axis (a vertical axis) of the ellipse. Thereafter, the second arithmetic processing unit 12 performs computation using this value as the X gain Gx. Similarly, the second arithmetic processing unit 12 computes the value of the magnetic data Z when the rotation angle θz is 0°, that is, a maximum voltage of the magnetic data Z represented by the length (major axis) of a long axis (a horizontal axis) of the ellipse. Thereafter, the second arithmetic processing unit 12 performs computation using this value as the Z gain Gz. Note that a circle figure is a special ellipse wherein the major axis thereof and the minor axis thereof have the same length. Thus, a circle figure is included in the concept of the ellipse.

In this example, the pitch angle α and the X gain Gx of the magnetic data X have correlation (a one-to-one correspondence) shown in FIG. 9. Similarly, the pitch angle α and the Z gain Gz of the magnetic data Z have correlation (a one-to-one correspondence) shown in FIG. 9. Accordingly, the correlation between the X gain Gx of the magnetic data X and the pitch angle α and the correlation between the z gain Gz of the magnetic data Z and the pitch angle α shown in FIG. 9 can be tabulated and stored in the memory unit 17.

After the control unit 16 acquires the X gain Gx or the Z gain Gz computed by the second arithmetic processing unit 12 when the mobile device 1 is rotated one revolution about the z-axis, the control unit 16 generates an access code x0 from the X gain Gx or an access code z0 from the Z gain Gz, as shown in FIG. 9. Subsequently, the control unit 16 accesses the memory unit 17 using the access code x0 or z0 so as to read out a pitch angle α0 corresponding to the access code x0 or z0 from among a plurality of pitch angles α stored in the memory unit 17. The control unit 16 then outputs the pitch angle α0 to the third arithmetic processing unit 13.

The third arithmetic processing unit 13 substitutes the pitch angle α0 and the magnetic data X into equation (5) so as to compute the azimuth θ of the mobile device 1. In addition, the fourth arithmetic processing unit 14 subtracts the magnetic declination D for the measuring location from the azimuth obtained in this manner so as to obtain an azimuth θ' with respect to true north.

As noted above, according to the present invention, the magnetic data X, Y, and Z are computed using the three magnetic sensors 3, 4, and 5, and the pitch angle α0 prestored in the memory unit 17 is read out. Accordingly, the need for a dedicated inclination sensor can be eliminated. That is, the magnetic sensors 3, 4, and 5 for detecting the magnetic data X, Y, and Z, the first arithmetic processing unit 11, the second arithmetic processing unit 12, the control unit 16, and the memory unit 17 function as an inclination sensor for computing a pitch angle (an inclination angle) α.

Alternatively, in order to obtain a pitch angle α, the following technique may be employed.

Figure 8:
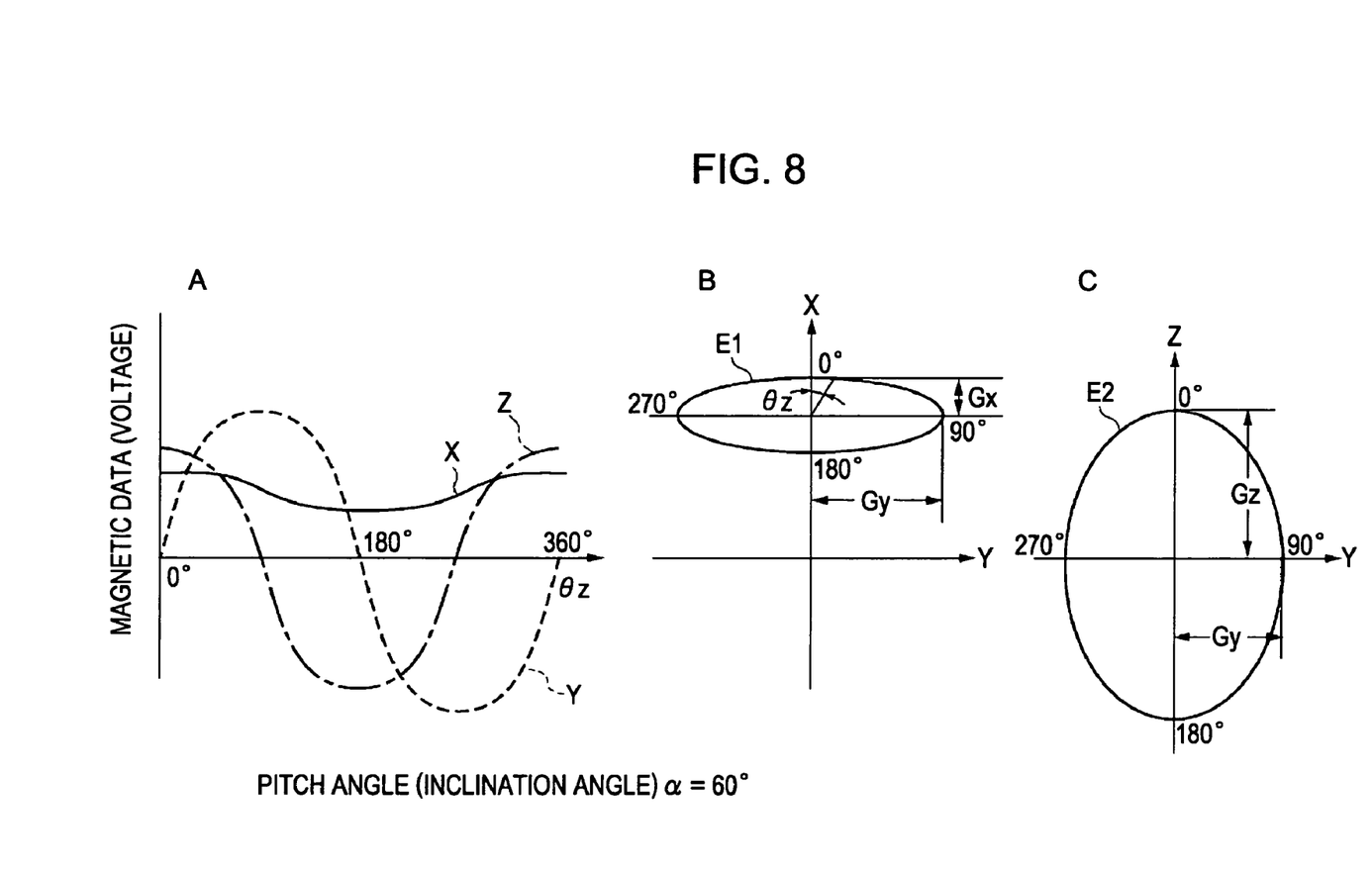
FIG. 8A is a graph illustrating a relationship between a rotation angle and magnetic data X, Y, and Z when the mobile device is rotated at a pitch angle α=60°.
FIG. 8B illustrates a Lissajous curve formed by the magnetic data Y and the magnetic data X.
FIG. 8C illustrates a Lissajous curve formed by the magnetic data Y and the magnetic data Z.

In this technique, the value of the magnetic data Y when the rotation angle θz is 90° or 270°, that is, the length of the major axis or the minor axis in the transverse direction when the magnetic data Y represents a maximum voltage as shown in FIG. 5 or 8 is computed. Thereafter, this value is considered as the Y gain Gy. Thereafter, a ratio of the above-described X gain Gx to the Y gain Gy (a ratio of the major axis to the minor axis) Gx/Gy or a ratio of the above-described Z gain Gz to the Y gain Gy (a ratio of the major axis to the minor axis) Gz/Gy is computed.

Here, it is assured that the pitch angle α and the ratio Gx/Gy have a predetermined correlation (a one-to-one correspondence) shown in FIG. 10 and, similarly, the pitch angle α and the ratio Gz/Gy have a predetermined correlation (a one-to-one correspondence) shown in FIG. 10. Accordingly, the correlation between the pitch angle α and the ratio Gx/Gy or the correlation between the pitch angle α and the ratio Gz/Gy shown in FIG. 10 can be tabulated and stored in the memory unit 17.

After the control unit 16 generates an access code from the ratio Gx/Gy or the ratio Gz/Gy computed by the second arithmetic processing unit 12 when the mobile device 1 is rotated one revolution about the z-axis. Subsequently, the control unit 16 accesses the memory unit 17 using the access code so as to read out a pitch angle α0 corresponding to the access code as in the above-described manner. The pitch angle α0 obtained in this way is output to the third arithmetic processing unit 13 as in the above-described manner.

In this method, the pitch angle α is computed using the ratio of the major axis to the minor axis of the ellipse. Accordingly, for example, even when the offset overlaps each of the magnetic data X, Y, and Z, the offset can be canceled, and therefore, the effect of the offset can be reduced. Consequently, the accuracy can be increased compared with the method for computing the pitch angle α using only the X gain Gx or the Z gain Gz.

To obtain the X gain Gx, the Y gain Gy, and the Z gain Gz in high precision in the above-described method, the mobile device 1 needs to be rotated at least one revolution (360°).

However, it is not practical to cause an operator to rotate the mobile device 1 more than or equal to 360° every time azimuth detection is performed on the mobile device 1. In addition, even when the operator rotates the mobile device 1 one revolution, it is not expected to obtain an exact circle figure and ellipse.

Accordingly, a method for acquiring the X gain Gx, the Y gain Gy, and the Z gain Gz without causing the operator to perform such a complicated rotational operation is described below.

Figure 11:
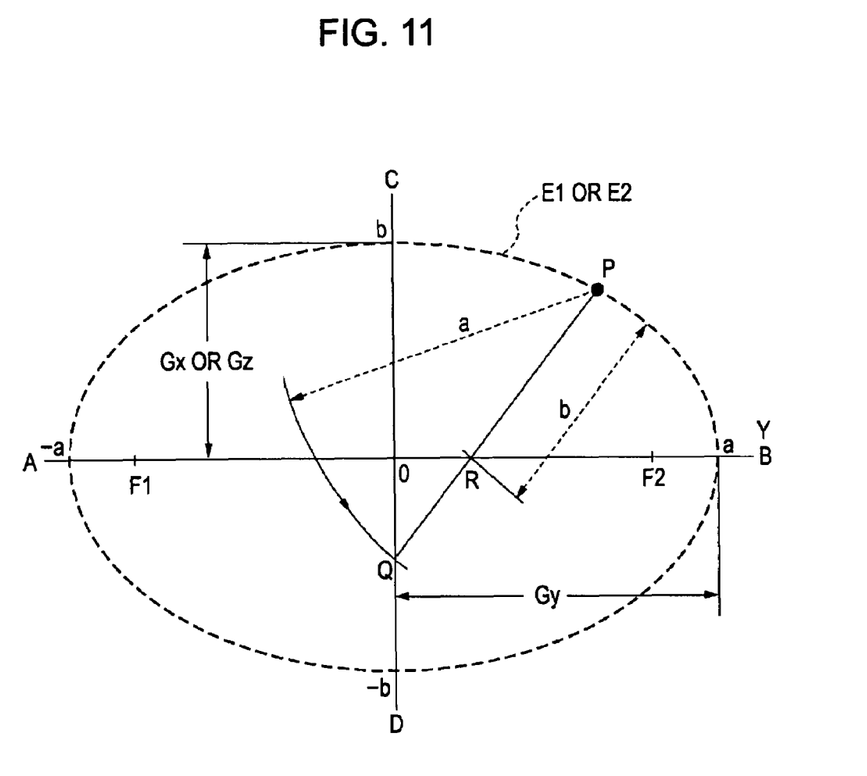
FIG. 11 illustrates a technique for computing a gain using a drawing method.

FIG. 11 illustrates a first technique for computing a gain using a drawing method. FIG. 11 illustrates a Lissajous curve (an ellipse) corresponding to that shown in FIGS. 5B to 8B or FIGS. 6C to 8C.

The ellipse shown in FIG. 11 has a major axis AB in the transverse axis and a minor axis CD in the longitudinal axis. The length of the major axis AB is $2a$. The length of the minor axis CD is $2b$. In this case, the Y gain Gy corresponds to the length a, which is a half of the major axis AB in the transverse axis. The X gain Gx or the Z gain Gz corresponds to the length b, which is a half of the minor axis AB in the longitudinal axis.

As shown in FIGS. 5B to 8B or FIGS. 5C to 8C, the Y gain Gy of the magnetic data Y has a length a in the transverse axis. This value is a known value that is always constant. Accordingly, the Y gain Gy (the length a) can be stored in the memory unit 17. At that time, the magnetic data X, Y, and Z that pass through a point P on the ellipse can be detected by the magnetic sensors 3, 4, and 5.

To obtain the minor axis of the ellipse in such a state, the major axis AB ($=2a$), which corresponds to twice the length a (a known value), is drawn first. Subsequently, a perpendicular bisector CD of the major axis AB is drawn. Subsequently, a circular arc having the center point P and a radius of AB/2=a is drawn. At that time, a point at the intersection of the circular arc with the perpendicular bisector CD is defined as a point Q. Finally, a point R at the intersection of a line PQ with the major axis AB is obtained. Then, a line PR has a length of b, which is a length of the ellipse in the longitudinal axis direction (also referred to as a "short axis length" or a "minor axis"). Here, PR=b.

That is, in the above-described technique, if the length a of the ellipse in the transverse axis (also referred to as a "long axis length" or a "major axis") and one point on the ellipse are known, the short axis length (a minor axis) b of the ellipse can be obtained. That is, the Z gain Gz and the Y gain Gy corresponding to the short axis length (a minor axis) of the ellipse can be obtained.

In the above-described technique, the X gain Gx and the Z gain Gz can be easily obtained without rotating the mobile device 1 one revolution, that is, by acquiring the magnetic data X, Y, and Z corresponding to the above-described point P. Accordingly, from the magnetic data X, Y, and Z representing a plurality of points on the ellipse obtained when the mobile device 1 is slightly rotated, an average value of the short axis lengths (minor axes), that is, the average value of the X gain Gx and the Z gain Gz can be easily obtained. Furthermore, the average value of the ratios Gx/Gy of the X gain Gx to the known Y gain Gy or the average value of the ratios Gz/Gy of the above-described Z gain Gz to the Y gain Gy can be easily obtained. Accordingly, a precise pitch angle (an inclination angle) α can be obtained without rotating the mobile device 1 one revolution.

Figure 12:
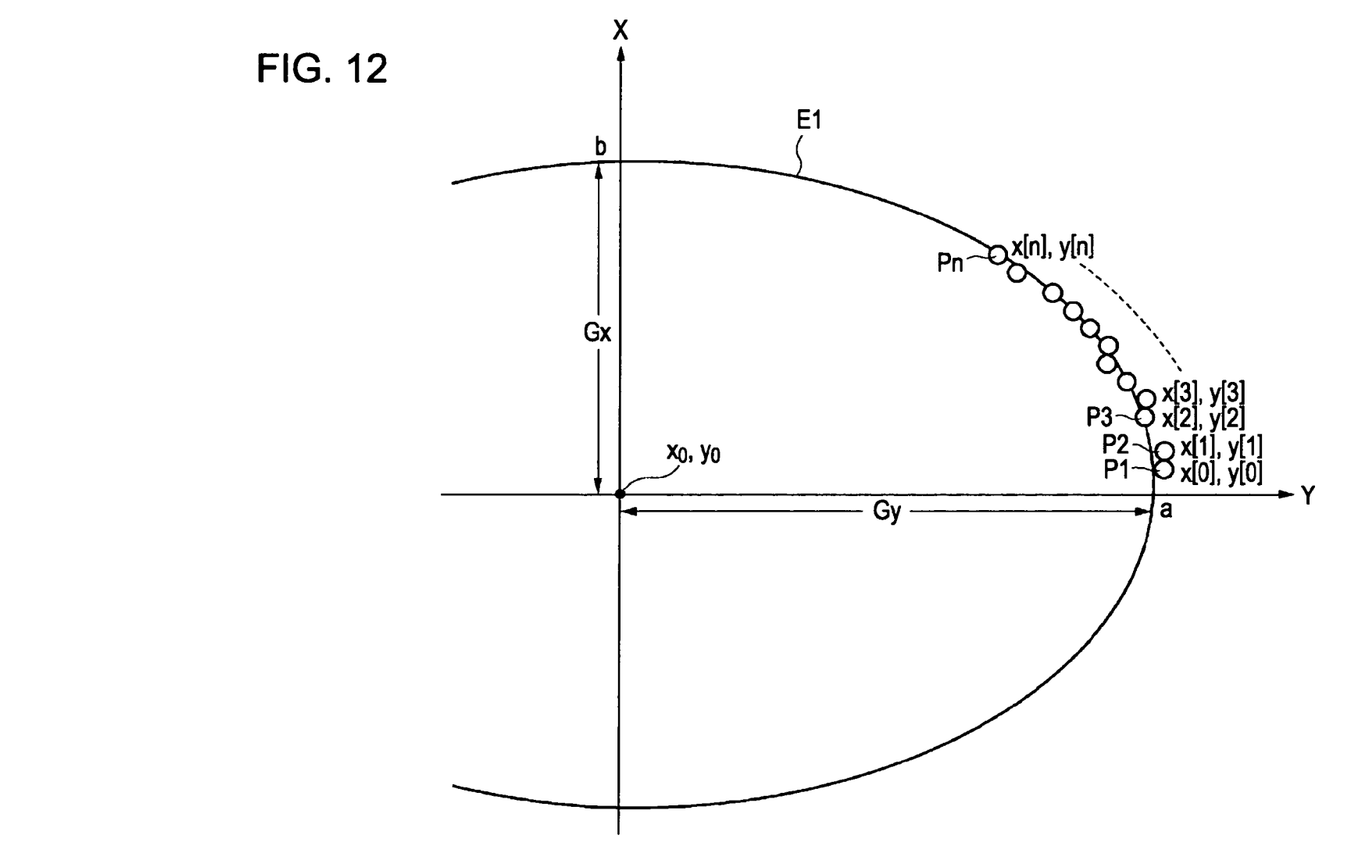
FIG. 12 is a Lissajous curve illustrating a second technique for computing a gain.

As a second technique for computing the X gain Gx, the Y gain Gy, and the Z gain Gz, the nonlinear least-squares method can be employed as follows. FIG. 12 is a Lissajous curve illustrating the second technique for computing the gains. FIG. 12 illustrates an ellipse corresponding to FIGS. 5B to 8B or FIGS. 6C to 8C.

In this method, it is assumed that when the mobile device 1 is rotated about the z-axis in the xy plane, a Lissajous curve E1 formed from a plurality of the magnetic data Y and X becomes an ellipse trace, which is a sort of circular arc trace.

That is, for example, a plurality of coordinates P0(x(0), y(0)), P1(x(1), y(1)), P2(x(2), y(2)), . . . that correspond to the magnetic data (X, Y) and that form the Lissajous curve E1 are substituted into a function F(x,y) based on the following elliptic equation. At that time, for the coefficients a and x0 and the coefficients b and y0 that satisfy the function F(x, y)=0, errors between the logical solution by the ellipse and actual magnetic data group (x, y) are compared with each other. This computation is repeated until the result is converged.

$$F(x, y) = \frac{\{x(n) - x0\}^2}{a^2} + \frac{\{y(n) - y0\}^2}{b^2} - 1 \qquad (6)$$

Note that, as shown in FIG. 12, one of the coefficients a and b represents the major axis of the ellipse and the other represents the minor axis of the ellipse. The coefficients x0 and y0 represent the center coordinates (the center point) of the ellipse. To obtain the coefficients a and x0, the coefficients b and y0 are set to known values. To obtain the coefficients b and y0, the coefficients a and x0 are set to known values.

In order to solve a nonlinear least-squares method, an orthonormal matrix may be formed from a Jacobian determinant first. Thereafter, the coefficients a and x0 or the coefficients b and y0 may be converged using the Gauss-Newton method.

By using the center coordinates (x0, y0) and the coefficients a and b obtained in the above-described manner, the X gain Gx and the Y gain Gy can be obtained. Similarly, the Y gain Gy and the Z gain Gz can be obtained from the Lissajous curve E2 formed from a plurality of the magnetic data Y and the magnetic data Z.

Thereafter, by using a ratio Gx/Gy computed from the X gain Gx and the Y gain Gy obtained in this manner and a ratio Gz/Gy computed from the Y gain Gy and the Z gain Gz obtained in this manner, a precise pitch angle (an inclination angle) α can be obtained without rotating the mobile device 1 one revolution, but with only a slight revolution.

While the embodiments above have been described with reference to the computing means 10 including the separate first to fourth arithmetic processing units 11, 12, 13, and 14, the present invention is not limited thereto. For example, one computing means 10, that is, the computing means 10 also serving as the first to fourth arithmetic processing units 11, 12, 13, and 14 may be employed.

In addition, while the embodiments above have been described with reference to a pitch angle of the mobile device 1 rotated about the x-axis as an example of the inclination angle α, the present invention is not limited thereto. For example, the inclination angle α may be a roll angle of the mobile device 1 rotated about the y-axis. Furthermore, the description has been made when the mobile device 1 is rotated about the z-axis, the description can be applied to the mobile device 1 rotated about another x-axis or y-axis or rotated about the three axes at the same time.

The invention claimed is:

1. An inclination sensor comprising:
a magnetic sensor for detecting magnetic components in three axis directions perpendicular to each other; and
computing means for acquiring an output from the magnetic sensor and performing computation, the computing means including at least a first arithmetic processing unit for converting the magnetic components in three axis directions so as to generate three magnetic data items, a second arithmetic processing unit for performing predetermined computation on the magnetic data items, a memory unit for storing a plurality of data items relating to an inclination angle, and a control unit for controlling the units and computing a predetermined access code from a value computed by the second arithmetic processing unit;
wherein, when the control unit accesses the memory unit, the control unit reads out the inclination angle corresponding to the access code.

2. The inclination sensor according to claim 1, wherein, when the magnetic sensor is rotated about any one of the three axes, the second arithmetic processing unit generates an elliptical Lissajous curve using the magnetic data items relating to the other two axes and calculates the length of one of a major axis and a minor axis of the ellipse, and wherein the control unit computes the access code using one of the lengths that changes in accordance with the rotation.

3. The inclination sensor according to claim 2 wherein the rotation about any one of the three axes is more than or equal to one revolution.

4. The inclination sensor according to claim 2 wherein, if the rotation about any one of the three axes is less than one revolution, the control unit computes the access code using the length of the minor axis of the ellipse obtained using the length of the major axis of the ellipse stored in the memory unit as a known value and magnetic data input as any one point on the ellipse, or the control unit computes the access code using a ratio between the length of the major axis and the length of the minor axis.

5. The inclination sensor according to claim 1, wherein, when the magnetic sensor is rotated about any one of the three axes, the second arithmetic processing unit generates an elliptical Lissajous curve using the magnetic data items relating to the other two axes and calculates the length of one of a major axis and a minor axis of the ellipse and a ratio between the length of the major axis and the length of the minor axis, and wherein the control unit computes the access code on the basis of the ratio between the length of the major axis and the length of the minor axis.

6. The inclination sensor according to claim 5 wherein the rotation about any one of the three axes is more than or equal to one revolution.

7. The inclination sensor according to claim 5 wherein, if the rotation about any one of the three axes is less than one revolution, the control unit computes the access code using the length of the minor axis of the ellipse obtained using the length of the major axis of the ellipse stored in the memory unit as a known value and magnetic data input as any one point on the ellipse, or the control unit computes the access code using a ratio between the length of the major axis and the length of the minor axis.

8. An azimuth measuring apparatus, wherein an azimuth is computed using the magnetic data items converted from the magnetic components in the three axis directions and an inclination angle computed by the inclination sensor according to claim 1.

9. The azimuth measuring apparatus according to claim 8, further comprising:

magnetic inclination and declination acquiring means for detecting the measuring location using radio waves received from GPS artificial satellites;

wherein data relating to the magnetic inclination and the magnetic declination corresponding to the measuring location are read out from a memory unit.

10. The azimuth measuring apparatus according to claim 8, further comprising:

magnetic inclination and declination acquiring means for detecting a measuring location via communication with a relay station of a cell phone system;

wherein data relating to the magnetic inclination and the magnetic declination corresponding to the measuring location are acquired from a memory unit or via the relay station.

* * * * *